United States Patent
Dilabio et al.

(10) Patent No.: US 9,704,101 B2
(45) Date of Patent: *Jul. 11, 2017

(54) METHOD FOR OPERATING AN ELECTRONIC STATE DEVICE BY PERTURBATING DANGLING BOND ELECTRONIC STATES

(71) Applicants: National Research Council of Canada, Ottawa (CA); The Governors of the University of Alberta, Edmonton (CA)

(72) Inventors: Gino A. Dilabio, Edmonton (CA); Robert A. Wolkow, Edmonton (CA); Jason L. Pitters, Edmonton (CA); Paul G. Piva, Edmonton (CA)

(73) Assignees: National Research Council of Canada, Ottawa, CA (US); The Governors of the University of Alberta, Edmonton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,459

(22) Filed: Jun. 28, 2016

(65) Prior Publication Data
US 2016/0307112 A1    Oct. 20, 2016

Related U.S. Application Data

(63) Continuation of application No. 14/940,752, filed on Nov. 13, 2015, now Pat. No. 9,400,957, which is a (Continued)

(51) Int. Cl.
*H01L 49/00* (2006.01)
*G06N 99/00* (2010.01)
(Continued)

(52) U.S. Cl.
CPC ............ *G06N 99/002* (2013.01); *B82Y 10/00* (2013.01); *H01L 29/66977* (2013.01);
(Continued)

(58) Field of Classification Search
CPC ............... H01L 29/66977; H01L 49/06; Y10S 977/782; Y10S 977/774; Y10S 977/933
(Continued)

(56) References Cited

U.S. PATENT DOCUMENTS 5,051,786 A    9/1991   Nicollian et al.
5,202,290 A    4/1993   Moskovits
(Continued)

FOREIGN PATENT DOCUMENTS

WO    03023817 A3    3/2003
WO    2005124674     12/2005
(Continued)

OTHER PUBLICATIONS

Haider et al., "Controlled Coupling and Occupation of Silicon Atomic Quantum Dots at Room Temperature", Phys. Rev. Lett. 102 046805, Jan. 27, 2009, American Physical Society, USA.
(Continued)

*Primary Examiner* — Stephen W Smoot
(74) *Attorney, Agent, or Firm* — Avery N. Goldstein; Blue Filament Law PLLC

(57) ABSTRACT

A quantum device is provided that includes controllably quantum mechanically coupled dangling bonds extending from a surface of a semiconductor material. Each of the controllably quantum mechanically coupled dangling bonds has a separation of at least one atom of the semiconductor material. At least one electrode is provided for selectively modifying an electronic state of the controllably quantum mechanically coupled dangling bonds. By providing at least one additional electron within the controllably quantum
(Continued)

mechanically coupled dangling bonds with the proviso that there exists at least one unoccupied dangling bond for each one additional electron present, the inventive device is operable at least to 293 degrees Kelvin and is largely immune to stray electrostatic perturbations. Room temperature operable quantum cellular automata and qubits are constructed therefrom.

26 Claims, 7 Drawing Sheets

Related U.S. Application Data continuation of application No. 14/448,899, filed on Jul. 31, 2014, now Pat. No. 9,213,945, which is a continuation of application No. 12/997,812, filed as application No. PCT/IB2009/006400 on Jun. 17, 2009, now Pat. No. 8,816,479.

(60) Provisional application No. 61/073,126, filed on Jun. 17, 2008.

(51) Int. Cl.
*B82Y 10/00* (2011.01)
*H01L 29/66* (2006.01)

(52) U.S. Cl.
CPC ......... *H01L 49/006* (2013.01); *Y10S 977/774* (2013.01); *Y10S 977/782* (2013.01); *Y10S 977/933* (2013.01)

(58) Field of Classification Search
USPC .................................................. 257/E49.003
See application file for complete search history.

(56) References Cited

U.S. PATENT DOCUMENTS

| | | | |
|---|---|---|---|
| 5,346,851 A | 9/1994 | Randall | |
| 5,447,873 A | 9/1995 | Randall | |
| 5,530,263 A | 6/1996 | DiVincenzo | |
| 5,614,435 A | 3/1997 | Petroff | |
| 5,643,828 A | 7/1997 | Ugajin | |
| 5,646,418 A | 7/1997 | Frazier | |
| 5,646,420 A | 7/1997 | Yamashita | |
| 5,663,571 A | 9/1997 | Ugajin | |
| 5,671,437 A | 9/1997 | Taira | |
| 5,679,961 A | 10/1997 | Higurashi | |
| 5,783,840 A | 7/1998 | Randall | |
| 5,834,378 A | 11/1998 | Kurtz et al. | |
| 5,889,288 A | 3/1999 | Futatsugi | |
| 5,923,046 A | 7/1999 | Tezuka | |
| 5,965,212 A | 10/1999 | Dobson | |
| 6,033,972 A | 3/2000 | Ro | |
| 6,118,686 A | 9/2000 | Taira | |
| 6,268,273 B1 | 7/2001 | Kim | |
| 6,323,504 B1 | 11/2001 | Shin | |
| 6,333,516 B1 | 12/2001 | Katoh | |
| 6,596,555 B2 | 7/2003 | Bensahel | |
| 6,597,010 B2 | 7/2003 | Eriksson | |
| 6,597,036 B1 | 7/2003 | Lee | |
| 6,635,898 B2 | 10/2003 | Williams | |
| 6,661,022 B2 | 12/2003 | Morie | |
| 6,670,670 B2 | 12/2003 | Chae | |
| 6,756,292 B2 | 6/2004 | Lee | |
| 6,770,916 B2 | 8/2004 | Ohshima | |
| 6,794,265 B2 | 9/2004 | Lee | |
| 6,946,346 B2 | 9/2005 | Chae | |
| 6,949,793 B2 | 9/2005 | Choi | |
| 6,988,058 B1 | 1/2006 | Sherwin | |
| 7,006,267 B2 | 2/2006 | Franson | |
| 7,015,497 B1 | 3/2006 | Berger | 257/14 |
| 7,018,852 B2 | 3/2006 | Wu | |
| 7,022,628 B2 | 4/2006 | Kim | |
| 7,105,874 B2 | 9/2006 | Chae | |
| 7,144,458 B2 | 12/2006 | Zehnder | |
| 7,208,753 B2 | 4/2007 | Yang | |
| 7,219,018 B2 | 5/2007 | Vitaliano | |
| 7,250,319 B2 | 7/2007 | Liu | |
| 7,259,068 B2 | 8/2007 | Choi | |
| 7,303,937 B2 | 12/2007 | Chen | |
| 7,307,030 B2 | 12/2007 | Song | |
| 7,323,725 B2 | 1/2008 | Yoshii | |
| 7,338,858 B2 | 3/2008 | Koh | |
| 7,351,997 B2 | 4/2008 | Ofek | |
| 7,358,525 B2 | 4/2008 | Lee | |
| 7,364,923 B2 | 4/2008 | Lidar | |
| 7,381,625 B2 | 6/2008 | Xi | |
| 7,382,017 B2 | 6/2008 | Duan | |
| 7,402,832 B2 | 7/2008 | Lee | |
| 7,405,126 B2 | 7/2008 | Choi | |
| 7,419,849 B2 | 9/2008 | Kumagai et al. | |
| 7,428,562 B2 | 9/2008 | Beausoleil | |
| 9,213,945 B2 * | 12/2015 | Dilabio | B82Y 10/00 |
| 9,400,957 B2 * | 7/2016 | Dilabio | B82Y 10/00 |
| 2003/0066998 A1 | 4/2003 | Lee | |
| 2004/0215585 A1 | 10/2004 | Benjamin | |
| 2005/0201149 A1 | 9/2005 | Duan | |
| 2005/0202615 A1 | 9/2005 | Duan | |
| 2006/0091375 A1 | 5/2006 | Freedman | |
| 2006/0134931 A1 | 6/2006 | Lin | |
| 2006/0151775 A1 | 7/2006 | Hollenberg et al. | 257/14 |
| 2006/0179029 A1 | 8/2006 | Vala | |
| 2006/0243962 A1 | 11/2006 | Tang | |
| 2006/0260016 A1 | 11/2006 | Greentree | |
| 2007/0194297 A1 | 8/2007 | McCarthy | |
| 2007/0196937 A1 | 8/2007 | Itoh | |
| 2007/0215862 A1 | 9/2007 | Beausoleil | |
| 2007/0221986 A1 | 9/2007 | Kang | |
| 2007/0247904 A1 | 10/2007 | Duan | |
| 2007/0249064 A1 | 10/2007 | De La Fuente | |
| 2007/0295621 A1 | 12/2007 | Lee et al. | |
| 2008/0012003 A1 | 1/2008 | Song | |
| 2008/0026532 A1 | 1/2008 | Duan | |
| 2008/0031296 A1 | 2/2008 | Spillane | |
| 2008/0067498 A1 | 3/2008 | Song | |
| 2008/0185576 A1 | 8/2008 | Hollenberg | |
| 2008/0191718 A1 | 8/2008 | Wolkow et al. | 324/691 |
| 2008/0237576 A1 | 10/2008 | Hawrylak | |
| 2010/0140586 A1 | 6/2010 | Char et al. | |

FOREIGN PATENT DOCUMENTS

| | | |
|---|---|---|
| WO | 2006133117 | 12/2006 |
| WO | 2008038970 | 4/2008 |
| WO | 2008044828 | 4/2008 |
| WO | 2008093087 | 8/2008 |
| WO | 2008118399 | 10/2008 |

OTHER PUBLICATIONS

Pitters et al., "Detailed Studies of Molecular Conductance Using Atomic Resolution Scanning Tunneling Microscopy", Nano Letters, vol. 6 No. 3, Feb. 10, 2006, pp. 390-397, American Chemical Society, USA.

Nacci et al., Conformational switching of single 1,5-cyclooctadiene molecules on Si(001) induced by inelastic electron tunneling, Physical Review B 77, 121405(R), Mar. 27, 2008, pp. 121405-1 thru 121405-4, American Physical Society, USA.

Gaudioso et al., "Vibrationally Mediated Negative Differential Resistance in a Single Molecule," Phys. Rev. Lett., vol. 85 No. 9, Aug. 28, 2000, pp. 1918-1921, American Physical Society, USA.

Rakshit et al., "Silicon-based Molecular Eiectronics", Nano Letters, vol. 4, No. 10, Oct. 2004, pp. 1803-1807, American Chemical Society, USA.

Quek et al., "Negative Differential Resistance in Transport through Organic Molecules on Silicon", Phys. Rev. Lett., vol. 96, Issue 6, Feb. 8, 2007, pp. 066807-1 thru 066807-4, American Physical Society, USA.

(56) References Cited

OTHER PUBLICATIONS

Bevan et al., "First-Principles Nonequilibrium Analysis of STM-Induced Molecular Negative-Differential Resistance on Si (100)", Phys. Rev. B 78. 035303, Jul. 1, 2008, American Physical Society, USA.
Aviram et al., "Molecular Rectifiers," Chem. Phys. Lett. vol. 29 Issue 2, Nov. 15, 1974, pp. 277-283.
Reed et "Conductance of a molecular junction," Science, vol. 278 No. 5336, Oct. 10, 1997, pp. 252-254 (1997).
Cui et al., "Reproducible measurement of single-molecule conductivity," Science, vol. 294 No. 5542, oct. 19, 2001, pp. 571-574.
Selzer et al., "Effect of local enviornment on molecular conduction: Isolated molecule versus self-assembled monolayer," Nano Lett., vol. 5, No. 1, Dec. 2, 2004, pp. 61-65, American Chemical Society, USA.
Wold et al., "Distance dependence of electron tunneling through self-assembled monolayers measured by conducting probe atome force microscopy. Unsaturated versus saturated molecular junctions," J. Phys. Chem. B. vol. 106 No. 11, Mar. 21, 2002, pp. 2813-2816. American Chemical Society, USA.
Wang et al., "Inelastic electron tunneling spectroscopy of an alkanedithiol self-assembled monolayer," Nano Lett., vol. 4 No. 4, Mar. 10, 2004, pp. 643-646, American Chemical Society, USA.
Kaun et al., "Momentum filtering effect in molecular wires," Phys. Rev. B 70, 195309, Nov. 9, 2004, American Physical Society, USA.
Nazin et al., "Visualization and spectroscopy of a metal-molecule-metal bridge," Science, vol. 302, Oct. 3, 2003, pp. 77-81.
Yang et al., "Role of heating and current-induced forces in the stability of atomic wires," Phys. Rev. B 71, 041402(R) Jan. 13, 2005, American Physical, USA.
Damle et al., "Current-voltage characteristics of molecular conductors: two versus three terminal,"IEEE Trans. Nanotech., vol. 1, No. 3, Sep. 2002, pp. 145-153 (2002).
Emberly et al., "The smallest molecular switch," Phys. Rev. Lett., vol. 91 No. 18. 188301, Oct. 27, 2003, American Physical Society, USA.
Landman at al., "Small is different: energetic, structural, thermal, and mechanical properties of passivated nanocluster assemblies,"Faraday Discuss. 125. Oct. 23, 2003. pp. 1-22. Royal Societ of Chemistry, UK & USA.
De Franceschi et al., "Electron Cotuneling in a Semiconductor Quantum Dot," Phys. Rev. Lett., vol. 86 No. 5, Jan. 29, 2001, pp. 876-881, American Physical Society, USA.
Holleitner et al., "Probing and Controlling the Bonds of an Artificial Molecule. Science," vol. 297 No. 5578, Jul. 5, 2002 pp. 70-72, American Association for the Advancement of Science, USA.
Elzerman et al., "Few-electron quantum dot circuit with integrated charge read out," Phys. Rev. B. 67, 161308(R), Apr. 30, 2003, American Physical Society, USA.
Pioro-Ladriere et al., "Charge sensing of an artificial H2 + molecule in lateral quantum dots," Phys. Rev. B. 72, 125307, Sep. 7, 2005, American Physical Society, USA.
Gaudreau et al., "Stability Diagram of a Few-Electron Triple Dot," Phys. Rev. Lett., 97, 036807, Jul. 21, 2006, American Physical Society, USA.
Lent et al., "Quantum cellular automata," Nanotechnology 4, pp. 49-57, 1993, IPO Publishing Ltd, UK.
Lent, "Perspectives: Molecular Electronics: Bypassing the transistor paradigm," Science, vol. 288 No. 5471, pp. 1597-1599, Jun. 2, 2000, American Association for the Advancement of Science, USA.
Lent et al., "A device architecture for computing with quantum dots," Proceedings of the IEEE, vol. 85 No. 4, pp. 541-557, Apr. 1997, IEEE. USA.
Orlov et al., "Realization of a functional cell for quantu-dot cellular automata," Science, vol. 277 No. 5328, pp. 928-930, Aug. 15, 1997.
Yadavalli et al., "Fanout gate in quantum-dot cellular automata," Nanotechnology, 18, 375401, Aug. 22, 2007, IPO Publishing Ltd, UK.
Schroer et al., "Electrostatically defined serial triple quantum dot charged with few electrons," Phys. Rev. B 76, 075306, Aug. 3, 2007, American Physical Society, USA.
Cole et al., "Quantum-dot cellular automata using buring dopants," Phys. Rev. B 71, 115302, Mar. 7, 2005, American Physical, USA.
Lent et al., "Molecular quantum-dot cellular automata,"J. Am. Chem. Soc., vol. 125, pp. 1056-1063, Jan. 4, 2003, American Chemical Society, USA.
Piva et al., "Field regulation of single-molecule conductivity by a charged surface atom," Nature, vol. 435, pp. 658-661, Jun. 2, 2005, Nature Publishing Group.
Ebert, "Nano-scale properties of defects in compound semiconductor surface," Surface Science Reports, vol. 33, Issues 4-8, pp. 121-303, 1999, Elsevier, USA.
Lyding et al., "Nanoscale patterning and oxidation of H-passivated S(100)-2×1 surfaces with ultrahigh vacuum scanning tunneling microscope," Appl. Phys. Lett., vol. 64, Issue 15, pp. 2010-2012, Apr. 1994.
Ebert, "Atomic structure of point defects in compound semiconductor surfaces," Curr. Opin. In Solid State and Materials Science, vol. 5, pp. 211-250, 2001, Elsevier Science Ltd.
Boland, "Scanning tunneling microscopy study of the adsorption and recombinative desorption of hydrogen from the Si(100)-2×1 surface," Journal of Vacuum Science and Technology A. vol. 10, Issue 4, pp. 2458-2464, 1992.
Hitosugi et al., "Jahn-Teller distortion in dangling-bond linear chains fabricated on a hydrogren-terminated Si(100)-2×1 surface," Phys. Rev. Lett., vol. 82 No. 20, pp. 4034-4037, May 17, 1999, American Physical Society, USA.
Becke, "Density-functional thermochemistry. III. The role of exact exchance,"J. Chem. Phys., vol. 98(7), 5648-5652, Apr. 1, 1993, American Institute of Physics, USA.
Lee et al., "Development of the Colle-Salvetti correlation energy formula into a functional of the electron density," Phys. Rev. B vol. 37 No. 2, pp. 785-789, Jan. 15, 1988, American Physical Society, USA.
Frisch et al., "Gaussian 03 Revision C.02," (Gaussian, Inc., Wallingford, Connecticut, 2004).
Burkard et al., "Coupled quantum dots as quantum gates," Phys, Rev. B, vol. 59 No. 3, pp. 2070-2078, Jan. 15, 1999, American Physical Society, USA.
Weiner, "Transmission function vs energy splitting in tunneling calculations," J. Chem. Phys., vol. 69(11),pp. 4743-4749, Dec. 1, 1976, American Institute of Physics, USA.
Resca, et al., "Intervalley effective-mass theory: pseudopotential formulation," Phys, Rev. B. vol. 32 No. 2, pp. 1068-1076, Jul. 15, 1985, American Physical Society, USA.
Orlov et al., "Experimental demonstration of a binary wire for quantum-dot cellular automata," Appl. Phys. Lett, vol. 74 No. 19, pp. 2875-2877, May 10, 1999. American Institute of Physics, USA.
Qi et al., "Molecular quantum cellular automata cells. Electric field driven switching of a silicon surface bound array of vertically oriented two-dot molecular quantum cellular automata," J. Am. Chem. Soc., vol. 125 No. 49, pp. 15250-15259 Nov. 14, 2003, American Chemical Society, USA.
Antonelli et al., "Quantum-Dot Cellular Automata (QCA) circuit partitioning: problem modeling and solutions," Proceedings of the 41st annual conference on Design automation, 23.3, pp. 363-368, Jun. 7-11, 2004, San Diego, CA, USA.
Tucker et al., "Can single-electron integrated circuits and quantum computers be fabricated in silicon?," Int. J. Circuit Theory and Applications, vol. 28, Issue 6, pp. 553-562, Nov./Dec. 2000, John Wiley & Sons Ltd, USA.
Scherpereel, "Atomic Quantum Dots," Foresight Science & Technology Go/No Go Assessment Report, National Research Council of Canada, Project No. VST0308GN, Aug. 1, 2008.
Choo et al., Quantum Dot as a Resource for Teleportation and State Swapping, Physical Review B 75, 205321, May 14, 2007, pp. 205321-1 thru 205321-9, American Physical Society, USA.

* cited by examiner

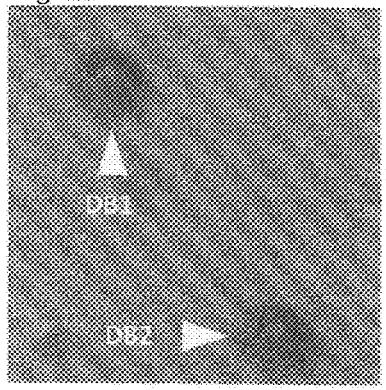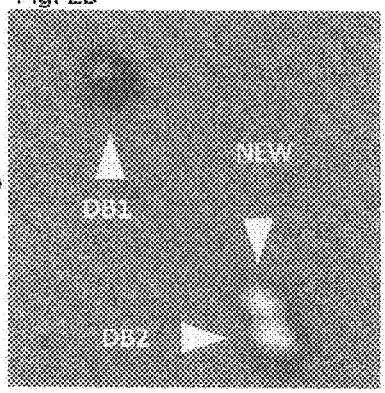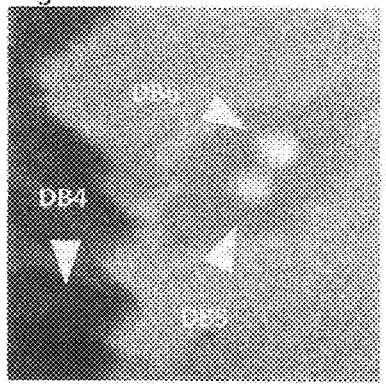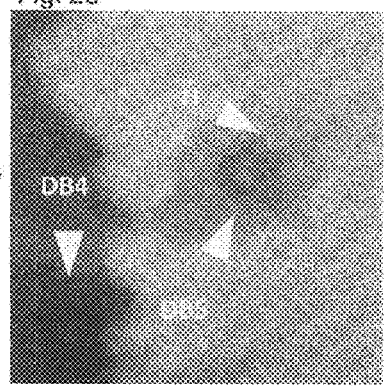

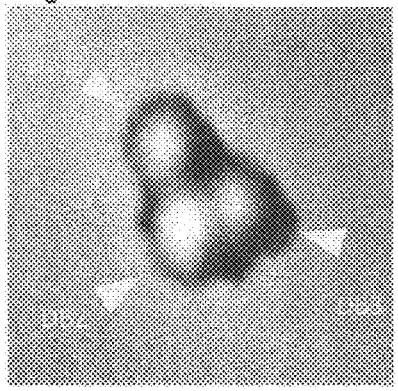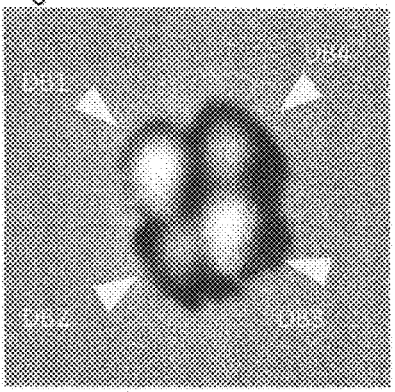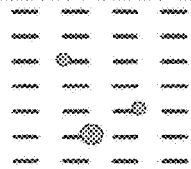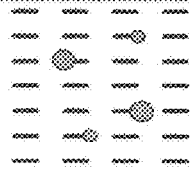

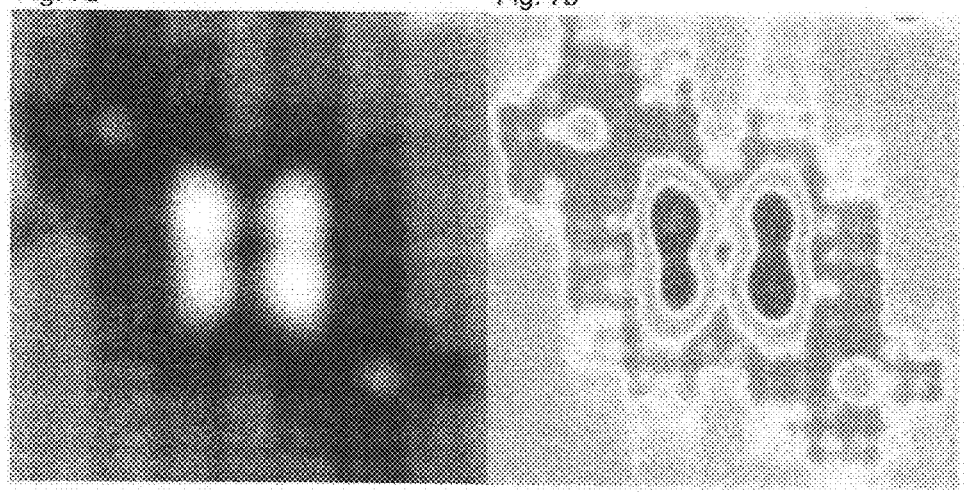

METHOD FOR OPERATING AN ELECTRONIC STATE DEVICE BY PERTURBATING DANGLING BOND ELECTRONIC STATES

CROSS-REFERENCED TO RELATED APPLICATION

This application is a continuation of U.S. application Ser. No. 14/940,752, filed Jul. 31, 2015; now U.S. Pat. No. 9,400,957 B2; which in turn is a continuation of U.S. application Ser. No. 14/448,899, filed Jul. 31, 2014; now U.S. Pat. No. 9,213,945 B2; which in turn is a continuation of U.S. application Ser. No. 12/997,812 having a 371(c)(1) date of Dec. 13, 2010; now U.S. Pat. No. 8,816,479 B2; that in turn is a United States National Phase application of Patent Cooperation Treaty application Serial Number PCT/IB2009/006400 filed Jun. 17, 2009; that in turn claims priority of U.S. Provisional Application Ser. No. 61/073,126 filed Jun. 17, 2008; the contents of which are incorporated herein by reference.

FIELD OF THE INVENTION

The present invention relates in general to atomistic electronics and in particular to a quantum cellular automata cell or qubit formed of single atom quantum dots.

BACKGROUND OF THE INVENTION

While considerable progress has been made in understanding properties relevant to the development of nano-electronics, integration of atomic, molecular or nano-scale entities into operational circuitry has been difficult (1-12). A quantum dot is typically comprised of a small cluster of atoms or molecules that exhibit quantized levels that are separated by energies intermediate to those in the bulk material and isolated single atoms or molecules. As quantum dots are often formed in place with spatial specificity within a larger circuit and specifically addressed, quantum dots represent the best demonstration to date of how digital circuitry can benefit from molecular electronics (13-17).

One goal that has eluded the field is the creation of multi-quantum dot ensembles to embody the Quantum Cellular Automata (QCA) scheme proposed by Lent and coworkers in 1993 (18). This new paradigm for computing is based upon "cells" of tunnel coupled quantum dots, and electrostatic interaction between adjacent cells. Such assemblies are predicted to transmit binary information and perform computations at extremely low energy cost (18, 19). The prototypical QCA cell is comprised of 4 quantum dots arranged as a square. Local electrode control provides a net cell charge of 2 electrons, of two degenerate, antipodal ground state electronic configurations. Local electrostatic electrodes break symmetry and cause the QCA unit to occupy one or the other of the diagonal 2 electron states. These states can be mapped as logic levels "0" and "1". By creating a sequence of cells, inter-cell electrostatic coupling allows binary information to be conveyed from one point to another. Elaborations of the QCA scheme allow full implementation of logic for computation while still retaining the conventions of binary digital computing. Retention of a binary computing scheme in QCA affords the benefit of allowing existing software to be run on an energy efficient QCA device.

In its simplest implementation, 4 quantum dot electrostatic QCA requires no quiescent current. The QCA scheme is "edge driven", that is, the logic inputs are also the power sources (20). QCA cells formed with quantum dots having dimensions on the order of tens of nanometers (19, 21), and a coupled 3 cell quantum wire (12) have been achieved. QCA-like processes were also observed in serial triple quantum dot systems (23). These efforts to form a QCA device have limited implications in routine computational schemes owing to the fact that temperatures in the milli-Kelvin range are required to prevent scrambling of states (20). Local, unintended fixed, or occasionally changing charges on the quantum dots, or spurious defect charges on a quantum dot make local electrostatic tuning to achieve 2 electron filling both necessary and challenging (20). Cryogenic conditions are also required for an approach based upon implanted dopants (24).

A qubit is a quantized information system controllably changed between two logic levels of "0" and "1" and is modeled as a two-dimensional complex vector space. Unlike digital logic element, qubits are preferably constructed to exhibit quantum entanglement that is a manifestation of perturbations and tunnel coupling between proximal elements. The qubit entanglement term affords an infinite set of superposition values intermediate between "0" and "1" levels that can render computation of many multi-variable dynamic events tractable. As with QCA devices, electronic state changing qubits have not been able to operate at ambient temperatures.

An atomistic quantum dot is based on a single atom or molecule and has a simplified set of orbital energy levels that are beneficial in terms of a reduced dimensionality and being less susceptible to unintended fixed, or sporadic charging relative to nanoparticle quantum dots. As a result of these and other expected attributes, molecular QCA cells have been envisioned with the goal of room temperature operation (25). Difficulties associated with localization and controlled addressing of molecular quantum dots has prevented molecular QCA cells from being produced. Similar problems exist for electronic state transition based qubits.

Thus, there exists a need for an electronically addressable molecular or atomic quantum dot with operational capabilities at temperatures above milli-Kelvin. There further exists a need for QCA and qubit devices containing ordered arrangements of molecular or atomic quantum dots.

SUMMARY OF THE INVENTION

A quantum device is provided that includes controllably quantum mechanically coupled dangling bonds of a material. Each of the controllably quantum mechanically coupled dangling bonds has a separation from the remainder of the controllably quantum mechanically coupled dangling bonds of at least one atom of the material. At least one electrode is provided for selectively modifying an electronic state of the controllably quantum mechanically coupled dangling bonds.

Silicon surface atoms bonded to only three other silicon atoms are well suited for formation of the dangling bonds and are formed with a desired separation. Separations of between 3 and 40 Angstroms are well suited for quantum mechanical coupling interactions between the dangling bonds. By providing at least one additional electron within the controllably quantum mechanically coupled dangling bonds with the proviso that there exists at least one unoccupied dangling bond for each one additional electron present, the inventive device is operable at least to 293 degrees Kelvin and is largely immune to stray electrostatic perturbations.

Quantum cellular automata operable at temperatures of 293 Kelvin and above are formed by providing multiple such devices in communication through interconnects. A qubit operable at temperatures of 293 Kelvin and above has controllably quantum mechanically coupled dangling bonds extending from a surface of a material and at least two electrodes forming a quantum circuit for quantum computation that provides an infinite set of superpositioned values intermediate between digital logic levels of 0 and 1.

BRIEF DESCRIPTION OF THE DRAWINGS

FIG. 1 is scanning tunneling microscopy (STM) micrographs showing a comparison of dangling bond (DB) images on hydrogen terminated Si(100) as a function of bulk doping densities (FIG. 1a, FIG. 1b) and separation distance (FIG. 1c, FIG. 1d). The upper inset shows the surface structure—silicon dimers are shown in black, subsurface silicon atoms in grey and hydrogen atoms as unfilled.

FIGS. 2a-2d are STM micrographs showing coupling and uncoupling of dangling bonds on hydrogen terminated Si(100). FIG. 2a is an STM micrograph of an area of 10×10 nm, collected at 2V, 0.2 nA. Two negative dangling bonds are indicated DB1 and DB2. FIG. 2b is an STM micrograph of an area of 10×10 nm, collected at 2V, 0.2 nA. A new DB is created by STM induced H desorption in close proximity to DB2. DB2 and DB3 are now coupled. FIG. 2c is an STM micrograph of an area 9×9 nm, collected at 2V, 0.2 nA. DB4 is isolated and negative. DB5 and DB6 are coupled. FIG. 2d is an STM micrograph of an area 9×9 nm, collected at 2V, 0.2 nA. A hydrogen atom (H) caps DB6. DB5 is now isolated and has become negative.

FIG. 3a shows isolated DBs, each negatively charged (a neutral DB has one electron occupation; a negative DB is occupied by two electrons at a ground state energy $E_0$). FIG. 3b shows the result of Coulombic repulsive interaction Ve1 and how one electron is excluded from a pair of coupled DBs, resulting in a net charge of one electron. The occupation state in which each DB has one extra electron, as shaded, becomes increasingly unfavorable with decreasing distance. The repulsive Hubbard on-site pairing energy U and the quantum mechanical splitting energy t are also indicated, and d is the nearest dimer-dimer distance. FIG. 3c indicates a perturbed double-well potential for two quantum mechanically coupled DBs in the vicinity of a third more distant negatively charged DB. A low surface area coverage of DBs is assumed, so that band bending is negligible at the surface remote from the immediate vicinity of a charged DB. CBM and VBM are the bulk conduction band minimum and the valence band maximum, respectively.

FIGS. 4a and 4b are STM micrographs showing coupling in non-symmetric DB arrangements. FIG. 4a shows 3 coupled DBs. The lattice positions of the DBs are shown below the image. Clear inequivalencies exist between the 3 DBs. DB2 is brightest while DB1 and DB3 appear darker. FIG. 4b shows the same area after a fourth coupled DB is created by removal of a single H atom. DB2 has become one of the less bright features while DB1 and DB3 are now brightest. Grids are shown below the micrographs to represent the DB positions on the silicon surface. The dashes represent silicon dimers and circles represent coupled silicon DBs. The size of the circle illustrates the intensity of the DB as it appears in the above STM images. The average height difference between the bright and less bright DBs is ~0.4 and ~0.7 Å for FIG. 4a and FIG. 4b respectively.

FIG. 6a shows two coupled DBs. The height profile of the DB pair is indicated in the lower profile curve of FIG. 6c. Only a small asymmetry is evident in the cross-sectional view. FIG. 6b is the same area shown in FIG. 6a after addition of a third DB. DB3 is negatively charged and not coupled to DB 1 and DB2. The height profile of the DB pair is indicated in the upper curve of FIG. 6c. DB2 now appears much brighter as a result of its proximity to the negatively charged DB3. The insets show grids to represent the DB positions on the silicon surface. The dashes represent silicon dimers, circles represent coupled silicon DBs and the upper leftmost circle represents an uncoupled, negatively charged silicon DB. The size of the DB1 and DB2 circles illustrates the intensity of the DB as it appears in the above STM images. FIG. 6c is a graphical comparison of relative height profiles for the DB pair prior to (lower) and after (upper) the addition of a perturbing DB (DB3). The line profiles are offset for clarity.

FIGS. 7a and 7b is STM images showing a rectilinear four coupled DB entity with an additional two electrostatic perturbing DBs diagonally placed. FIG. 7a is an STM image showing the 2 coupled DBs nearest the negative perturbing DB are relatively bright in appearance as a result of unfavored electron occupation at those sites. A grid is shown below the figure to represent the DB positions on the silicon surface. The dashes represent silicon dimers, circles represent coupled silicon DBs and X represents uncoupled, negatively charged silicon DBs. The size of the circle illustrates the intensity of the DB as it appears in the above STM image. The average height difference between the bright and less bright DBs is ~0.4 Å. FIG. 7b is an STM image showing the color mapping of the STM image in FIG. 7a to clearly delineate the topographic differences.

DETAILED DESCRIPTION OF THE PREFERRED EMBODIMENTS

Figure 1A:
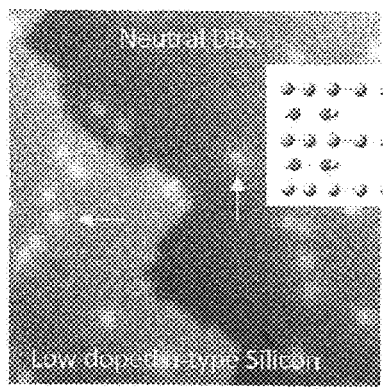
FIG. 1a is an STM micrograph of low doped n-type silicon (~$10^{16}$ cm$^{-3}$) for an area 35×35 nm, collected at 2V, 0.1 nA. Dangling bonds appear as bright spots (two are indicated with arrows).
Figure 1B:
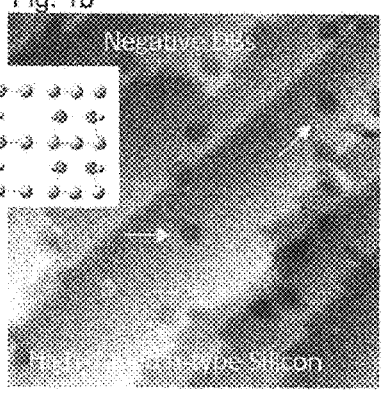
FIG. 1b is an STM micrograph of high doped n-type silicon (~$10^{19}$ cm$^{-3}$) for an area 35×35 nm, collected at 2.2 V, 0.1 nA. Dangling bonds appear as dark depressions with a central spot (two are indicated with arrows).
Figure 1C:
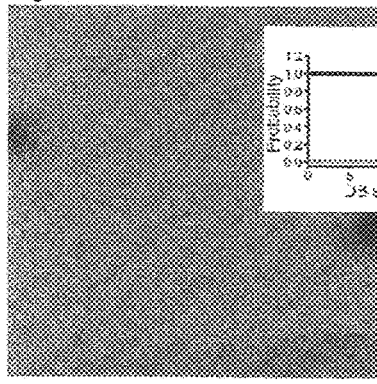
FIG. 1c is an STM micrograph of 9×9 nm, collected at 2V, 0.2 nA. The silicon surface appears uniform prior to hydrogen desorption.

The present invention has utility in forming atomistic electronic devices such as quantum cellular automata or qubits. An atomistic quantum dot is controllably quantum mechanically coupled to embody the building block of a Quantum Cellular Automata device or a computational qubit. In a preferred embodiment a dangling bond (DB) operates as the atomistic quantum dot. Such cells exhibit a self-biasing effect, in that the electron occupation is set by cell geometry and the Fermi level. The binary state of the cell is controlled electrostatically. Unlike previous milli-Kelvin implementations, inventive devices operate above milli-Kelvin and even at room temperature (of 293 Kelvin) and are largely immune to stray electrostatic perturbations. An inventive dangling bond quantum device is controlled through proximal electrostatic perturbing dangling bonds or a electrode either suspended above, below or on the surface supporting the inventive device. An electrode illustratively includes a thin film contact, nanowire or an STM tip. Optionally, the electrode is used or biased to sense localization dynamics of a coupled dangling bond.

Control over qubit Hamiltonian in order to perform unitary transformations occurs according to the present invention through the formation/removal of a perturbing species such as a DB or an electrode to create a unitary transformation within a coupled two DB qubit. Likewise, qutrits and quadrits are readily formed according to the present invention through coupling of 3 or 4 DBs, respectively. Still higher order DB entities containing 5, 6, 7, 8 and even more coupled DBs are also rendered possible as room temperature quantum computational devices according to the present invention.

An inventive device is characterized by ultra low power consumption, operation above 1K to room temperature and above, ultra high device density and the demonstrated "self-biasing" character when provided with additional electron charge. Operation as an electronic state transition QCA or qubit device at room temperature is so provided.

Single and multiple electrode structures are known to the art in the context of semiconductor quantum dot QCA and molecular QCA systems (38, 39). These electrode structures and arrangements are operative herein. An STM tip is used as an exemplary single electrode device. A two electrode system by way of example has a first logic input as a power source to perturb a DB and a second electrode monitoring the coupled DB electronic state.

An inventive device is formed by spatially controlled formation of dangling bonds (DBs) in a material. According to the present invention, silicon represents a preferred surface for the generation of dangling bonds. However, it is appreciated that other surfaces capable of supporting a localized charge that induces an electrostatic potential extending at least 1 Angstrom are operative herein. Other such materials illustratively include most semiconductor and compound semiconductor materials such as germanium, diamond, graphite, graphene, GaAs, InSb, transition metal chalcogenides, and thin insulator-on-conductor and thin insulator-on-semiconductor surfaces that can support charged atoms and/or quantum dots.

A single atom on the surface of a semiconducting material such as silicon is controllably charged within the range −1 to +1 electron charge. It is appreciated that similar control as to the charge of an atom of a different elemental identity than that of the host lattice is also achieved herein and includes at least one ionized impurity atom or molecule forming a dangling bond on a surface.

The atom to be charge controlled must have fewer bonding partners than is normal for that element with the non-partnered orbital forming the DB. For example a silicon atom, which would ordinarily share in four bonds, can be charged controllably if it is restricted to participating in only three bonds. That situation is achieved naturally at the surface of a silicon crystal where each surface atom has a three coordinate bonded. A single chargeable atom is created by bonding all but one surface silicon atom to a hydrogen atom, such that all surface silicon atoms share in three silicon-silicon bonds and one Si—H bond and forming multiple such DBs in spatially controlled proximity. According to the present invention a single DB is readily formed on a silicon surface with spatial control. Spatial control allows for controlled construction of DBs and sensing leads therefor to develop a practical quantum computing architecture based on dangling bond electron configurations. This is in contrast to prior art doping of a silicon lattice with a phosphorus atom that lacks positional control over the location of the phosphorus atom.

Such an atom has associated with the DB a spatially localized electronic energy state that is within the band gap. The DB is higher in energy than the bulk semiconductor valence band edge, while lower in energy than the bottom of the conduction band edge. As the DB is energetically decoupled from the conduction band, the DB has an atomistic quality that makes QCA and qubit inventive devices operative beyond milli-Kelvin and up to and exceeding 293 Kelvin. This inventive attribute is in stark contrast to prior art QCA devices have required operation of milli-Kelvin. The particular charge level of a DB is a function of several parameters, principally those are the density of gap states, the doping concentration of the bulk crystal and the physical placement of and the relative electrostatic potential applied thereto.

With the distance dependent coupling of two or more atoms having DBs via an electron quantum mechanical interaction QCA and qubit devices are formed that operate at temperatures above 1 degree Kelvin and even above 293 degrees Kelvin. When a DB is utilized under conditions of ordinary negative charge thereon, Coulombic repulsion provides a self-biasing attribute to the DB and any device containing the DB, namely, that incomplete electronic occupation occurs and inter-atom quantum mechanical interaction and in particular tunneling is thereby enabled. Quantum mechanical coupling is evident at distances of approximately 4 to 20 Angstroms. The electrostatic setting of a bi-stable 4 silicon atom QCA cell into one logic state is demonstrated at room temperature. Similarly, the same DB ensembles are operative as pure or entangled qubits.

A −1 charged DB qubit is considered a preferred component in QCA owing to the robust, room temperature performance. It is appreciated that a neutral pair of DBs in proximity to allow for controllable quantum mechanical coupling form an artificial molecular entity resembling $H_2$ with a preselected inter-DB separation that upon excitation functions as a qubit. By extension, more than two quantum mechanically coupled neutral DBs can mimic various electron configurations of cyclic carbon $\pi$ electron systems.

FIG. 1$d$ depicts the effect of distance between DBs, with closely spaced DBs taking on a "brighter" appearance as compared to more remote adjacent DBs. It is also seen that beyond some threshold, further reduced separation leads to further enhanced brightening. By controlled removal of single H atoms from a hydrogen passivated Si surface, DBs are formed in a desired pattern with a controlled distance between adjacent DBs. At least one atom lacking a DB separates adjacent DBs to limit the extent of Coulombic coupling to a degree that facilitates device formation. Based on the presence of at least one atom lacking a DB between adjacent DBs the extreme cases of two DBs on one silicon dimer (20) or on adjacent dimers in a row (21) are specifically excluded from the inventive devices. It is appreciated that different semiconductor surface faces are utilized to modify the angular and surface atom separation of DBs. In addition to the (100) surface, other surfaces operative herein illustratively include (110), (111), (010), (311), miscut surfaces and all reconstructions of these surfaces. It is appreciated that a DB is also readily formed on edge surfaces; at interfaces between disparate materials, especially those with lattice mismatch; within the bulk ordered and amorphous material. With a lateral separation of between 2 and 200 Angstroms between adjacent DBs a degree of quantum mechanical coupling is provided that is suitable for a QCA device or qubit entanglement. The exact distance is material-dependent and a function of material electrostatic potential. FIGS. 2a and 2b are STM images that demonstrate that an isolated negative DB (labeled DB2) enters into a coupling arrangement when offered a sufficiently close partner (DB3). The new DB in FIG. 2b is formed by selective single H atom removal. Once paired, the DB common to FIGS. 2a and 2b no longer has the STM image halo characteristic of an uncoupled DB. Both DBs exhibit the bright appearance of coupled DBs and the coupled pair is encircled by a dark halo in the STM image of FIG. 2b.

FIGS. 2c and 2d are STM images that demonstrate the elimination of the coupling effect through the elimination of one of a pair of DBs, by combining one DB (labeled DB6) with an H atom. A DB state once converted to an H-capped entity loses the capacity to hold an extra electron, the remaining DB becomes effectively isolated and negatively charged (DB5).

Two sufficiently close DBs are quantum mechanically coupled. As through-space covalent bonding is negligible beyond DB separations of about ~4 Angstroms, the lattice mediates in the quantum mechanical coupling of DB wavefunction.

An inventive device based on electron confinement and electron quantum mechanical interaction in a system having DBs separated by between 3.4 and 20 Angstroms is also understood through computational modeling.

Density functional theory (DFT) modeling is performed on an inventive system using the B3LYP (32, 33) functional, as implemented in the Gaussian-03 (34) package, with 3-21 G basis sets. The model used for the calculations consisted of pyramidal cluster of 396 silicon atoms with a 2×1 surface reconstruction and had three rows of seven dimers. The cluster contained two phosphorus dopant atoms. The two phosphorus atoms provide two excess electrons needed to charge two of the surface dangling bonds (DBs). One DB is stepped along one side of a dimer row toward a second DB of fixed position. A third DB, placed near one corner of the 2×1 face of the cluster, serves as an electron accepting site for the electron that is excluded from the closely-spaced DB pair when the Coulombic repulsion in the closely-spaced DB pair becomes large.

B3LYP calculations on a smaller cluster are used to provide a picture of the one-electron state of the charged DB. The physical extent on the DB state is clearly bounded by the row structure of the H—Si(100)-2×1 surface. In order to explore DB coupling, a harmonic oscillator potential is utilized (35). The DBs are also modeled for atomic impurities in Si (37). However, unlike a donor atom in a bulk dielectric material, which has a large effective radius, DBs are localized surfaces states. As such, the DB electrons are partially localized in the vacuum region above the surface with greater spatial breadth in the Si medium.

An effective two-dimensional harmonic oscillation is used to describe the confinement of an electron in a DB, with the electron effective mass equal to the free electron mass me. Based in the geometries of a silicon surface, the effective two-dimensional potential of an isolated DB must allow for electron escape from the DB orbital into the semiconductor bulk conduction band (CB). Therefore, outside the harmonic well region $r<R_h$, the potential curve levels off to the bulk conduction band minimum. In this simple model, the isolated DB wavefunction has the form of a simple Gaussian-type function, and a ground state energy of $E_0+\hbar\omega$. The parameter $\omega$ is set such that the spatial extent of the DB wavefunction reflects that obtained from DFT modeling of about 3.8 Angstroms. The well depth is fitted to recover the correct values of the binding energy of an extra electron in a DB. Electrons quantum mechanically interact between neighboring DBs, provided that their separation is small enough, and that the Coulomb repulsion prevents full occupancy of the two DBs. The quantum mechanical interaction causes an energy splitting of the ground state energy of the system (36).

Figures 3A, 3B, 3C:
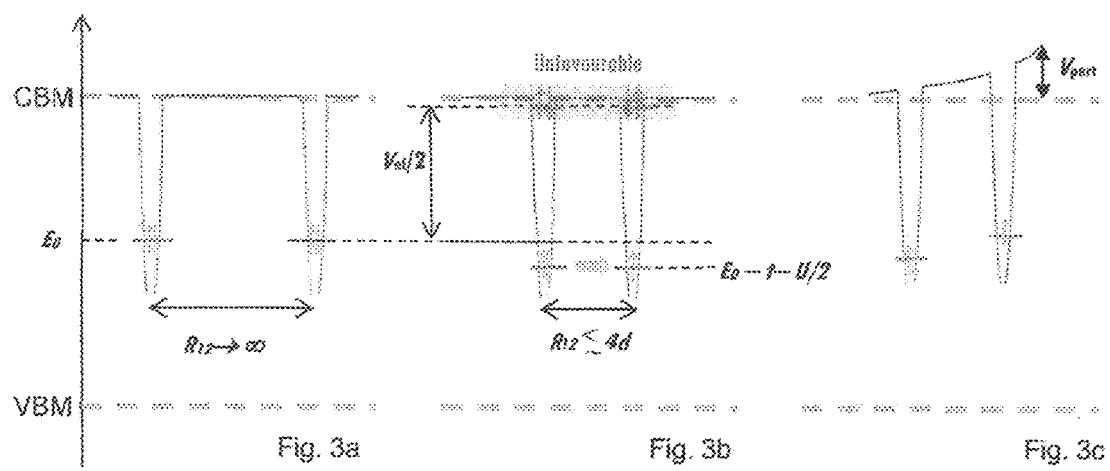
FIGS. 3a-3c are a plot of paired DBs as variably spaced potential wells (FIG. 3a) and (FIG. 3c) and a Coulombic repulsion schematic (FIG. 3b).

In FIG. 3, the two-dimensional harmonic oscillator model is shown and provides a qualitative description of the behavior of two isolated DBs. The potential wells in FIG. 3 plateau asymptotically at the CB energy. FIG. 3a depicts two potential wells, sufficiently separated laterally to be uncoupled. The horizontal line crossing each well represents the bound DB level, capable of holding up to two electrons each. FIG. 3b represents 2 DBs laterally separated by less than about 20 Angstroms. Two key changes relative to decoupled DBs are shown. As a result of Coulombic repulsion, the occupation state with 2 electrons per DB is destabilized (shifted upward in energy). The two DB states are shown to be more stable if one electron is excluded from one of the DBs. The excluded electron goes into a bulk energy level. Though the partially empty level associated with the coupled DBs appears capable of accommodating one more electron, the act of occupation raises that level above the CB, making that configuration unstable. This is a result of both an on-site (repulsive) pairing energy—modeled as the "Hubbard U" term (38)—but also and more substantially increased Coulombic repulsion when two electrons are so localized. The effect of quantum mechanical interaction on electron energy levels is also included via the tunneling splitting energy t.

Two conditions allow electron quantum mechanical interactions between coupled DBs. When close enough, the barrier separating the DBs is sufficiently narrow to permit substantial quantum mechanical exchanges between the two DBs. But crucially, the exclusion of one electron from the paired DBs provides a partially empty state and therefore a destination for a tunneling electron. Without intending to be bound to a particular theory, the relatively bright appearance of coupled DBs is based upon expulsion of one of the 2 extra electrons causing upward band bending to be reduced, enabling relatively easy injection of electrons from the STM tip to the CB and a brighter appearance. Here, "extra" refers to the number of electrons greater than that required for neutrality. For example, 4 electrons at 2 DBs corresponds to a charge of −2 or 2 "extra" electrons. Though the charge at coupled DBs is reduced, resulting in an appearance more like that of neutral DBs (FIG. 1a), the pair-encircling dark halo due to an extra electron, distinguishes coupled DBs from neutral DBs.

Figure 1D:
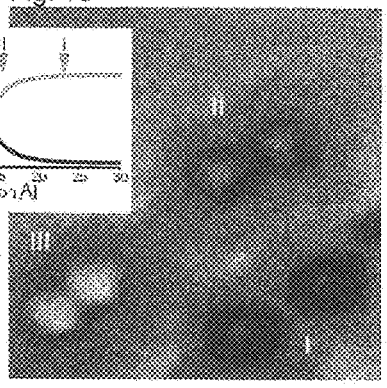
FIG. 1d is an STM micrograph of 9×9 nm, collected at 2V, 0.2 nA. Three groups of dangling bonds are prepared. (I) A non-coupled DB pair at 2.32 nm. (II) A coupled DB pair at 1.56 nm. (III) A coupled DB pair at 1.15 nm. The lower inset indicates the charging probabilities of a DB pair based on separation distance. The solid and hatch-marked curves represent one and two electron occupation respectively. Positions I, II, and III correspond to the related DB pairs in part (FIG. 1d).

The increased brightness of a DB pair with decreasing DB separation is a manifestation of the crossover between charging states −2 to −1. The injected STM current increases because of decreasing local band bending. One can control the average electron occupation of coupled DBs by DB separation distance. The DBs spaced by approximately 23 Angstroms to 1 electron as DBs become closer than 10 Angstroms, accounting for the increasingly bright appearance of DB pairs with decreasing separation, as seen in FIG. 1d and is shown graphically in the FIG. 1 inset for one electron (black solid line) and for 2 electrons (hatch-marked line).

The confinement potential used for an isolated DB allows for electron escape from the DB orbital into the bulk conduction band and outside the harmonic well region $r<R_h$, the potential curve levels off to the bulk conduction band minimum (CBM), which is thus taken as the zero value for the confinement potential at $r \to \infty$.

Thus, as an illustrative model, a finite/truncated confinement potential is chosen as $$V_{DB}(r) = \left(\frac{m\omega^2}{2}r^2 - V_0\right)f_{tr}(r), \quad (1)$$

where $\omega$ is the classical oscillation frequency of the electron in the well, $V_0$ is the potential depth (measured from the CBM), and $f_{tr}$ is a truncation function, which ensures the finite range of the harmonic potential. We choose a simple form for $$f_{tr}(r)=[1-\tan h((r-R_b))w)]/2, \quad (2)$$

where the parameters $R_b$ and w determine the location and the width of the truncation region, respectively.

In this simplified model, the isolated DB wavefunction has the form of a simple Gaussian-type function, $\psi_0(r) = A\exp(-\alpha r^2)$, and a ground state energy of $E_0=\hbar\omega$ (with respect to the potential bottom), where $\alpha = m\omega/2\hbar$, and A is a normalization constant. The parameter $\omega$ is set such that the spatial extent of the simple Gaussian DB wavefunction reflects that obtained from density function theory (DFT) harmonic oscillator modeling of about 3.8 Angstroms. The binding energy of an electron in the harmonic oscillator (HO) well is then $E_b=E_{CB}-E_0$ where $E_{CB}$ is the conduction bond energy and $E_0$ is the ground state energy. The well depth is fitted to recover the binding energy of the HO as calculated by the DFT methods detailed above.

A double well potential for describing a quantum mechanically-coupled DB pair was simply built by combining the single well potentials of the two DBs according to $$V_{12}(r) = \frac{1}{2}V_{DB1}(|r-r_1|)\left[1-\tanh\frac{|r-r_1|-R_h}{w}\right] + \frac{1}{2}V_{DB2}(|r-r_2|)\left[1-\tanh\frac{|r-r_2|-R_h}{w}\right] \quad (3)$$

which has the effect of $V_{12}(r)$ being approximately equal to either $V_{DB1}$ or $V_{DB2}$, depending on which DB is closer to the point r.

For a double well system, the quantum mechanical tunneling coefficient calculated within the WKB approximation (36) is $$D = \exp\left\{-\frac{2}{\hbar}\int_{-a}^{a}\sqrt{2m(V_{12}(r)-E)}\,dr\right\}, \quad (4)$$

where $\pm a$ are the classical turning points of the potential barrier. Accordingly, the tunneling splitting interaction is calculated as $$t = \frac{\hbar\omega}{\pi}\exp\left\{-\frac{1}{\hbar}\int_{-a}^{a}\sqrt{2m(V_{12}(r)-E)}\,dr\right\}. \quad (5)$$

A device composed of n DBs on the H—Si (100) surface where n is an integer between 2 and $\infty$. In order to calculate the charging probabilities of this device with a number of i electrons, the effects of the DB system being in contact with a reservoir (the bulk crystal), with a temperature T and a chemical potential $E_F$ (i.e. the grand canonical ensemble) are determined. The probability occurrence of a charging state with a given number of extra electrons in the DB cell is calculated.

In order for a DB device to have an integer number of extra electrons, and a well-defined polarization, an inventive device operates in a regime where the quantum mechanical tunneling energies are much smaller than the Coulomb energies, $t<<V_{el}$ (8) as required in a QCA device. Neglecting the quantum mechanical tunneling contributions to the charging energies, at room temperature, due to statistical fluctuations, all charging states have a finite probability of occurrence. Assuming classical statistics, each charging state is characterized by a statistical weight, equal to a Boltzmann factor for each charging state. Thus, for one electron charging, the weight is $$f_{1e}=g_{1e}\exp[-(E_{1e}^{tot}-E_F)/kT] \quad (6)$$

where $E_{1e}^{tot}$ is the total energy of the n-DB cell with one extra electron, k is the Boltzmann constant, T is the temperature, and $g_{ie}$ is the degeneracy of the charging state i. Assuming there are no external perturbations, $E_{1e}^{tot}=-E_b$, where all energies are measured from the CB level.

Similarly, the two electron charging weight is $$f_{2e}=g_{2e}\exp[-(E_{2e}^{tot}-2E_F)/kT], \quad (7)$$

with $E_{2e}^{tot}=-2E_b+V_{2e}^{tot}$ and $V_{2e}^{tot}$ being the total electrostatic energy of the cell. The latter interaction is calculated simply as a point-charge interaction $$V_{2e}^{tot} = \frac{1}{4\pi\varepsilon_0\varepsilon_{srf}}\frac{e^2}{d}, \quad (8)$$

where e is the elementary charge, d is the DB separation, and $\varepsilon_{srf}$ is the effective dielectric constant of the surface.

Similarly, the weight of any charging state i is $$f_{ie}=g_{ie}\exp[-(E_{1e}^{tot}-iE_F)/kT]. \quad (9)$$

In calculating the total charging energies of the device, the quantum mechanical tunneling energies are neglected, and only considered the lowest energy configuration for a given charging state. For example, diagonal occupancy only for a doubly charged 4-DB device is considered, and no allowed configuration with the electrons on adjacent DBs.

The partition function of the n-DB cell is then $$Z=f_{1e}+f_{2e}+\ldots+f_{ne}, \quad (10)$$

and the probabilities of each charging state i are then $p_{ie}=f_{1e}$ Z, for i=1,n. For instance, in order to have a "definitely" doubly occupied 4-DB cell, we need to fulfill the condition $p_{1e},p_{3e},p_{4e}<<p_{2e}\cong 1$.

In the lower inset of FIG. 1, the charging probabilities for an isolated 2-DB device are shown as a function of the DB separation. The value of the binding energy $E_b$ for a doubly occupied DB is taken to be 0.32 eV. A small surface coverage of DBs, as assumed in FIG. 1 lower inset, so that band bending is negligible at the surface, except in the vicinity of the DB cell. The probability of charging state 0, $p_{0e}$ is calculated to be four orders of magnitude smaller than $p_{1e}$, and therefore it is neglected in subject calculations. Comparing DB STM images on hydrogen terminated highly doped n-type Si(100) taken for various separation distances appearing in FIG. 1d: (I) 2.32 nm, (II) 1.56 nm, and (III) 1.15 nm. The plot of probability of charging state as a function of DB separation inset between FIGS. 1c and 1d indicate the separation distances for DB pairs I, II and III per FIG. 1d. The hatch-marked curve represents two electron probability of charging state. The effective dielectric constant for interaction between 2 charged DBs is around $\in_{srf} \cong 4$. This is lower than the classically derived value of 6.5 (27). Without intending to be bound to a particular theory, the lower DB $\in_{srf}$ value compared to the bulk is believed to be the result of the DB orbitals being partially localized in vacuum and elevated with respect to the surrounding Si surface atoms. This value of $\in_{srf}$ is also roughly corroborated by fitting the location of the crossover between the charging states −1 and −2 to STM images of DB pairs at decreasing distances as in FIG. 1.

Accounting for the charging probability of a DB, an estimate of the quantum mechanical tunneling rates between two quantum mechanically-coupled DBs is provided as the product of the frequency of attempts $\omega/2\pi$, the tunneling coefficient D, and the probability of having an unoccupied second DB when the first DB is occupied, equal to $p_{1e}=1-p_{2e}$.

$$k_{tun} = \frac{\omega}{2\pi} D_{p_{1e}}, \quad (11)$$

where $p_{1e}$ is the probability of having 1 extra electrons in a 2-DB cell. The black curve in the inset graph in FIG. 1 provides the probability of the single electron charging state as a function of DB separation.

The ratio of quantum mechanical tunneling rate is controlled by a variety of device factors. These factors illustratively include DB separation, which increases quantum mechanical tunneling rate as DB separation decreases, barrier height, and charging state probabilities. These latter factors are modified by varying the doping level, semiconductor material identity and/or using electrodes to vary the local electrostatic potential.

FIG. 4a shows 3 coupled DBs. As a result of different time-averaged electron occupation, the brightness varies among the DBs. DB2, for example, has the most pronounced appearance and is therefore least negative. In FIG. 4b a fourth coupled DB (labeled DB4) is shown as created by STM tip-induced removal of a single H atom. The schematic in FIG. 4 shows that the four DB structure deviates from a regular rectangular Si(100) arrangement and instead is rectilinear.

The most widely separated DBs in the group of four DBs (labeled DB2 and DB4) are darkest in appearance. Upon accounting for upward band bending and local STM image darkening with localized negative charge (22), it is apparent that the extra electrons in this structure were predominantly located at the most distant DBs—consistent with the expectation that the greatest charge separation corresponds to the lowest energy configuration.

As at least one empty state is required to allow quantum mechanical interactions between DBs, which in turn leads to the relatively bright appearance of coupled DBs, it is evident that at least one electron has been excluded, and, as a group-encircling dark halo is present, it is evident that some extra electrons remain localized at this grouping. The exact charging state of a DB cell depends on the Fermi level of the sample, $E_F$ (which in turn depends on temperature and dopant concentration), and for a fixed $E_F$, on the distances between the DBs in the device. Computation allows this determination to be refined; it is found that Coulombic repulsion is too great for 3 electrons to be bound on the structure shown in FIG. 4, supporting an occupation of 2 extra electrons.

Figure 5:
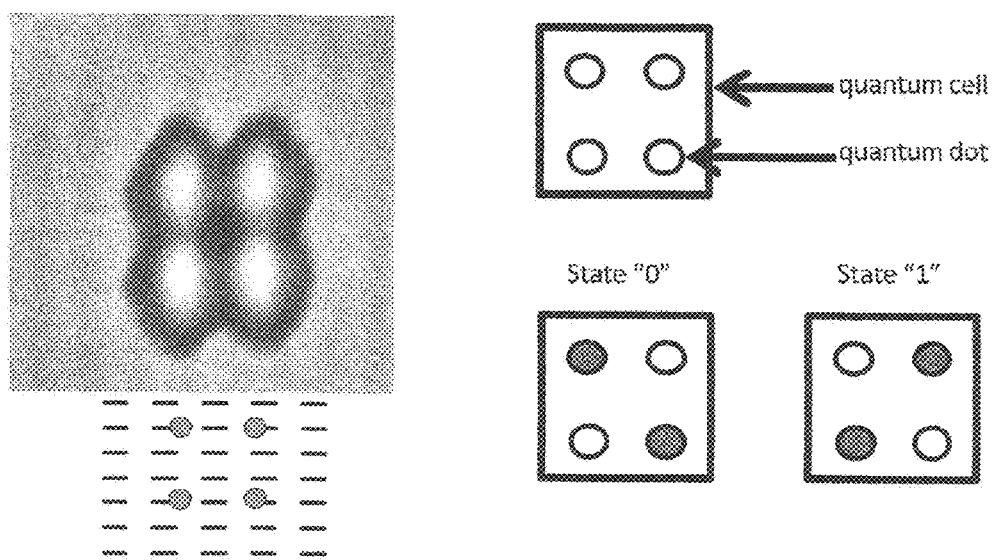
FIG. 5 is an STM image of coupling in symmetric DB arrangements. A symmetric group of 4 DBs created by the removal of four single H atoms from Si(100). The bright appearance of the DBs indicates the individual DBs are coupled. The DB heights are equal within 0.1 Å. A grid is shown below the figure to represent the DB positions on the silicon surface. The dashes represent silicon dimers and red circles represent coupled silicon DBs. A schematic of a single QCA cell is shown adjacent to the micrograph. Cells in binary states "0" and "1" are shown.

FIG. 5 shows 4 coupled DBs. The 4 coupled DBs have laterally 2-fold symmetric structure reminiscent of the QCA scheme proposed by Lent and coworkers in 1993 (18). Such a device requires quantum mechanically coupled quantum dots and a net occupation of 2 electrons to result in two degenerate, antipodal ground state electronic configurations that can be mapped as logic levels "0" and "1", as shown in the schematic diagrams in FIG. 5. Electrostatic implementations to date have required temperatures in the milli-Kelvin range and have suffered from uncontrolled effects due to stray charges (20). The structure depicted in FIG. 5 is operative as a QCA the innate 2-fold electronic degeneracy to map those states onto binary states.

In order to describe the operational process of a 4 coupled DB grouping as a QCA with respect to selective electronic symmetry degeneration breaking, reference is now made to the simpler 2 coupled DB grouping to convey an understanding of the effect of a point electrostatic perturbation.

Figure 6A:
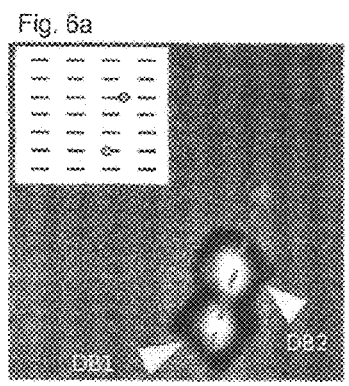
FIGS. 6a-6c are STM images providing a demonstration of an electrostatic perturbation on coupled DBs.
Figure 6B:
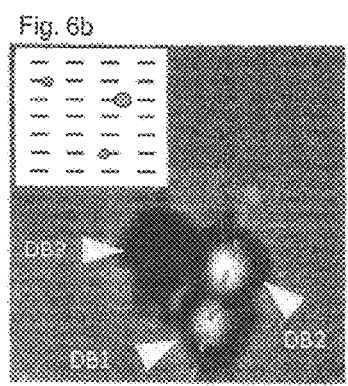
Figure 6C:
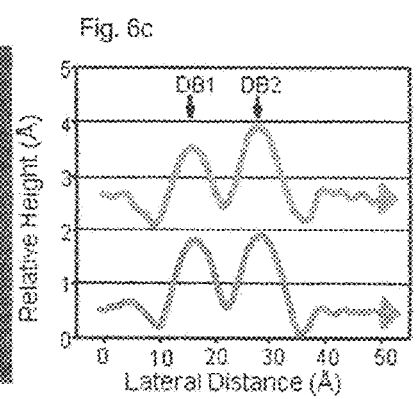

FIG. 6a shows a pair of coupled DBs. DB2 is marginally brighter in appearance than DB1. In FIG. 6b, a new effect is explored with the consequence of an additional perturbing DB (labeled DB3) being shown. The perturbing DB (DB3) is at too great a distance from the nearest DB to be significantly quantum mechanically coupled to the remaining DBs. The uncoupled character of perturbing DB3 is made evident by the dark appearance due to the localization of 2 electrons thereon. While perturbing DB3 does not significantly interact via a quantum mechanical relationship, it does exert a repulsive Coulombic effect that is clear in the line profile shown in FIG. 6c where an electrostatic perturbation has caused DB2 to become appreciably brighter than DB1.

This electrostatic coupling effect is exemplary of the type of gating required in a QCA device (20, 21). DB3 by breaking of symmetry leading to a dominance of one occupation over another selectively operates to break dependency in the DB1-DB2 coupled pair. It is notable that the coupled DBs reveal a "self-biasing" effect by spontaneously having 1, and not zero or two electrons in the 2 dot entity, thereby removing the need for a "filling" electrode to tune occupation. FIG. 3b illustrates this spontaneously one electron presence in a coupled DB pair effect. FIG. 3c illustrates the preferred occupation of one of a pair of quantum mechanically-coupled DBs because of the influence of a nearby perturbing DB. Note that filling control can be achieved through the use of conventional capacitive coupling methods, for example, with electrodes.

This single electronic spontaneous fill of a coupled DB pair extends to larger groupings of coupled DB pairs. Such coupled DB pairs can be formed in a variety of arrangements illustratively including linear, stepped linear patterns, rectangular, rectilinear, parallelogram, and other polygonal shapes to form cellular neural networks.

FIG. 7 shows 4 coupled DBs and 2 diagonally placed perturbing DBs. The schematic shows the positions of all 6 DBs. Consistent with a negative gating effect destabilizing electron occupation, it is seen that the two DBs within the grouping that are nearest the perturbing DBs appear brighter, indicating less negative charge is localized there. The observation of this electrostatically set antipodal state is enhanced in FIG. 7b.

Computation as to the grouping of FIG. 7 as detailed above reveals that a net charge of −3 entails prohibitive Coulombic repulsion. While both a −1 and a −2 charge are consistent with the antipodal pattern observed in FIG. 7 computations indicate that a charge state of −2 is favored on 4 DBs at the particular DB separations shown in FIG. 7. FIG. 7 shows a controlled electrostatic breaking of symmetry and represents an atomic scale embodiment and simplest functional demonstration of a QCA cell. Beyond operation of a coupled DB with an STM tip acting as an electrode, the construction of an electrode structure for a quantum dot device is known to the art (38, 39). The electrode structures are operative herein to produce a room temperature operative QCA through the ability to selectively place and charge DBs. Room temperature and above implementation of QCA based computation as has long been theorized but proven difficult to implement until the present invention.

It is appreciated that groupings of cells of 4 coupled DBs can be used to construct elements of a QCA computer. Different grouping of DB assemblies allows for data storage. Such architectures may be achieved through combination of one or more QCAs and/or qubits. As an inventive device exhibits quantum entanglement associated with an additional electron charge quantum mechanically coupling between DBs and as such the logic inputs also serve as the power source. It is appreciated that unlike conventional digital microelectronic devices, an inventive device is even operable with a single electrode. The management of the transfer of state information between nodes in QCA, and integration of QCA into VLSI architecture are known to the art (40).

Considerable latitude exists for control over electron occupation and device operation. Slightly more widely spaced configurations will reduce Coulombic repulsion to allow, and lead automatically to, a greater net charge. Similarly, closer spaced structures will naturally exhibit reduced charge levels. This "self biasing" to achieve a −2 cell charge as required by the QCA framework is most desirable as it removes the need for multiple and single cell-specific "filling" electrodes. Fixed charges beyond approximately 20 Angstroms from a grouping are calculated to be insignificant perturbations on the logic state and filling level of a Si DB-based QCA cell, in contrast to the acute sensitivity of some quantum dots to relatively distant unintended charges (41). The robustness of the inventive atomistic quantum dots results from the large energy level spacing of bound states compared to nanocrystal quantum dots and as a result DBs form devices operative at room temperature rather than requiring cryogenic conditions of prior art devices.

REFERENCES

1. Aviram, A. & Ratner, M. A. Molecular Rectifiers. *Chem. Phys. Lett.* 29, 277-283 (1974).
2. Reed M. A., Zhou, C., Muller, C. J., Burgin, T. P. & Tour J. M. Conductance of a molecular junction. *Science* 278, 252-254 (1997).
3. Cui, X. D., Primak, A., Zarate, X., Tomfohr, J., Sankey, O. F., Moore, A. L., Moore, T. A., Gust, D., Harris, G. & Lindsay, S. M. Reproducible measurement of single-molecule conductivity. *Science* 294, 571-574 (2001).
4. Seizer, Y., Cai, L., Cabassi, M. A., Yao, Y., Tour, J. M., Mayer, T. S. & Allara, D. L. Effect of local environment on molecular conduction: Isolated molecule versus self-assembled monolayer. *Nano Lett.* 5, 61-65 (2005).
5. Wold, D. J., Haag, R., Rampi, M. A. & Frisbee, C. D. Distance dependence of electron tunneling through self-assembled monolayers measured by conducting probe atomic force microscopy: Unsaturated versus saturated molecular junctions. *J. Phys. Chem. B* 106, 2813-2816 (2002).
6. Wang, W., Lee, T., Kretzschmar, I. & Reed, M. A. Inelastic electron tunneling spectroscopy of an alkanedithiol self-assembled monolayer. *Nano Lett.* 4, 643-646 (2004).
7. Kaun. C.-C., Guo, H., Grütter, P. & Lennox, R. B. Momentum filtering effect in molecular wires. *Phys. Rev. B* 70, 195309 (2004).
8. Nazin, G. V., Qiu, X. H. & Ho, W. Visualization and spectroscopy of a metal-molecule-metal bridge. *Science* 302, 77-81 (2003).
9. Yang, Z., Chshiev, M., Zwolak, M. & Di Ventra, M. Role of heating and current-induced forces in the stability of atomic wires. *Phys. Rev. B* 71, 041402(R) (2005).
10. Damle, P., Rakshit, T., Paulsson, M. & Datta, S. Current-voltage characteristics of molecular conductors: two versus three terminal. *IEEE Trans. Nanotech.* 1, 145-153 (2002).
11. Emberly, E. G. & Kirczenow, G. The smallest molecular switch. Phys. Rev. Lett. 91, (2003).
12. Landman, U. & Luedtke. W. D. Small is different: energetic, structural, thermal, and mechanical properties of passivated nanocluster assemblies. *Faraday Discuss.* 125, 1-22 (2004).
13. De Franceschi, S., Sasaki, S., Elzerman, J. M., van der Wiel, W. G., Tarucha, S. & Kouwenhoven, L. P. Electron Cotunneling in a Semiconductor Quantum Dot. Phys. Rev. Lett. 86, 878-881 (2001).
14. Holleitner, A. W., Blick, R. H., Hüttel, A. K., Eberl, K., Kotthaus, J. P. Probing and Controlling the Bonds of an Artificial Molecule. *Science* 297 70-72 (2002).
15. Elzerman, J. M., Hanson, R., Greidanus, J. S., Willems van Beveren, L. H., De Franceschi, S., Vandersypen, L. M. K., Tarucha, S. & Kouwenhoven, L. P. Few-electron quantum dot circuit with integrated charge read out. *Phys. Rev. B.* 67, 161308 (2003).
16. Pioro-Ladrière, M., Abolfath, M. R., Zawadzki, P., Lapointe, J., Studenikin, S. A., Sachrajda, A. S. & Hawrylak, P. Charge sensing of an artificial $H_{2+}$ molecule in lateral quantum dots. *Phys. Rev. B.* 72, 125307 (2005)
17. Gaudreau, L., Studenikin, S. A., Sachrajda, A. S., Zawadzki, P., Kam, A., Lapointe, J., Korkusinski, M. & Hawrylak, P. Stability Diagram of a Few-Electron Triple Dot. *Phys. Rev. Lett.* 97, 036807 (2006).
18. Lent, C. S., Tougaw, P. D., Porod, W. & Bernstein, G. H. Quantum cellular automata. *Nanotechnology* 4, 49-57, (1993).
19. Lent, C. S. Molecular Electronics: bypassing the transistor paradigm. *Science* 288, 1597-1599 (2000).

20. Lent, C. S. & Tougaw, P. D. A device architecture for computing with quantum dots. *Proceedings of the IEEE* 85, 541-557 (1997).
21. Orlov, A. O., Amlani. I., Bernstein. G. H., Lent, C. S. & Snider, G. L. Realization of a functional cell for quantum-dot cellular automata. *Science* 277, 928-930 (1997).
22. Yadavalli, K. K., Orlov, A. O., Timler, J. P., Lent C. S. & Snider G. L. Fanout gate in quantum-dot cellular automata. *Nanotechnology* 18, 375401 (2007).
23. Schröer, D., Greentree, A. D., Gaudreau, L., Eberl, K., Hollenberg, L. C. L., Kotthaus, J. P. & Ludwig S. Electrostatically defined serial triple quantum dot charged with few electrons, *Phys. Rev. B* 76, 075306 (2007).
24. Cole, J. H., Greentree. A. D., Wellard, C. J., Hollenberg, L. C. L. & Prawer S. Quantum-dot cellular automata using buried dopants. *Phys. Rev. B* 71, 115302 (2005).
25. Lent, C. S., Isaksen, B. & Lieberman, M. Molecular quantum-dot cellular automata. *J. Am. Chem. Soc.* 125, 1056-1063 (2003).
26. Piva, P. G., DiLabio, G. A., Pitters, J. L., Zikovsky J., Rezek, M., Dogel, S., Hofer, W. A. & Wolkow R. A. Field regulation of single-molecule conductivity by a charged surface atom. *Nature* 435, 658-661 (2005).
27. Ebert, Ph. Nano-scale properties of defects in compound semiconductor surfaces. *Surface Science Reports* 33, 121-303 (1999).
28. Lyding, J. W., Shen, T.-C., Hubacek, J. S., Tucker, J. R. & Abein, G. C. Nanoscale patterning and oxidation of H-passivated Si(100)-2×1 surfaces with an ultrahigh vacuum scanning tunneling microscope. *Appl. Phys. Lett.* 64, 2010-2012 (1994).
29. Ebert, Ph. Atomic structure of point defects in compound semiconductor surfaces. *Curr. Opin. In Solid State and Materials Science* 5, 211-250 (2001).
30. Boland, J. J. Scanning tunneling microscopy study of the adsorption and recombinative desorption of hydrogen from the Si(100)-2×1 surface. *J. Vac. Sci. Technol. A.* 10, 2458-2464 (1992).
31. Hitosugi, T., Heike, S., Onogi, T., Hashizume, T., Watanabe. S., Li, Z.-Q., Ohno, K., Kawazoe, Y., Hasegawa, T., & Kitazawa, K. Jahn-Teller distortion in dangling-bond linear chains fabricated on a hydrogen-terminated Si(100)-2×1 surface. *Phys. Rev. Lett.* 82, 4034-4037 (1999).
32. Becke, A. D. Density-functional thermochemistry. Ill. The role of exact exchange. *J. Chem. Phys.* 98, 5648-5652 (1993).
33. Lee, C., Yang, W. & Parr, R. G. Development of the Colle-Salvetti correlation energy formula into a functional of the electron density. *Phys. Rev. B* 37, 785-789 (1988).
34. Frisch, M. J., et al. Gaussian 03 Revision C.02 (Gaussian, Inc., Wallingford, Conn., 2004).
35. Burkard, G., Loss. D., & Di Vincenzo, D. P. Coupled quantum dots as quantum gates. *Phys. Rev. B* 59, 2070-2078 (1999).
36. Weiner, J. H. Transmission function vs energy splitting in tunneling calculations. *J. Chem. Phys.* 69, 4743-4749 (1978).
37. Resca, L. & Graft, R. D. Intervalley effective-mass theory: pseudopotential formulation. Phys. Rev. B 32, 1068-1076 (1985).
38. Orlov, A. O. et al. Experimental demonstration of a binary wire for quantum-dot cellular automata. *Appl. Phys. Lett.,* 74(19), 2875-2877 (1999).
39. Qi, H. et al. Molecular quantum cellular automata cells, electric field driven switching of a silicon surface bound array of vertically oriented two-dot molecular quantum cellular automata. *J. Am. Chem. Soc.,* 125, 15250-15259 (2003).
40. Antonelli, D. A. et al. Quantum-Dot Cellular Automata (QCA) circuit partitioning: problem modeling and solutions, Proceedings of the 41st annual conference on Design automation, Jun. 7-11, 2004, San Diego, Calif., USA.
41. Tucker, J. R. & Shen, T.-C. Can single-electron integrated circuits and quantum computers be fabricated in silicon? Int. J. Circ. Theor. Appl. 28, 553-562 (2000).

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A method for operating an electronic state data storage device comprising: placing an electrostatic species in proximity to a plurality of controllably quantum mechanically coupled dangling bonds so as to perturb an electronic state of said plurality of controllably quantum mechanically coupled dangling bonds of a material with each of said plurality of controllably quantum mechanically coupled dangling bonds having a separation from the remainder of said plurality of controllably quantum mechanically coupled dangling bonds of at least one atom of said material.

2. The method of claim 1 further comprising: at least one electrode to sense localization dynamics of a coupled dangling bond from amongst said plurality of controllably quantum mechanically coupled dangling bonds, monitor the electronic state of said plurality of controllably quantum mechanically coupled dangling bonds, or a combination thereof.

3. The method of claim 2 wherein said at least one electrode is above, below, or on a surface supporting said quantum device.

4. The method of claim 2 wherein said at least one electrode comprises at least one of a thin film contact, a nanowire, or a scanning tunneling microscopy (STM) tip.

5. The method of claim 4 wherein said STM tip is a single electrode device; and wherein said method further comprises using a first STM tip as a first logic input as a power source to perturb a dangling bond from amongst said plurality of controllably quantum mechanically coupled dangling bonds so as to perturb an electronic state of said plurality of controllably quantum mechanically coupled dangling bonds, and using a second STM tip to monitor a coupled dangling bond electronic state responding to said perturbed dangling bond.

6. The method of claim 5 wherein the electronic state of said plurality of controllably quantum mechanically coupled dangling bonds is one of two binary states.

7. The method of claim 5 wherein the electronic state of said plurality of controllably quantum mechanically coupled dangling bonds is one of an infinite set of superpositioned values intermediate between digital logic levels of 0 and 1.

8. The method of claim 1 wherein said material is silicon and each of said plurality of controllably quantum mechanically coupled dangling bonds extends from a silicon atom having silicon-silicon bonds.

9. The method of claim 1 wherein said plurality of controllably quantum mechanically coupled dangling bonds extend from a surface of said material.

10. The method of claim 1 wherein the separation is between 2 and 200 Angstroms inclusive.

11. The method of claim 1 wherein said separation is between 3 and 40 Angstroms inclusive.

12. The method of claim 1 wherein said plurality of controllably quantum mechanically coupled dangling bonds numbers 2, 3, 4, 5, or 6 dangling bonds.

13. The method of claim 1 wherein at least one electrostatic perturbing dangling bond is two electrostatic dangling bonds diagonally placed relative to said plurality of controllably quantum mechanically coupled dangling bonds arranged as four dangling bonds forming a rectilinear four coupled dangling bond entity.

14. The method of claim 1 wherein said plurality of controllably quantum mechanically coupled dangling bonds are four dangling bonds forming a rectilinear four coupled dangling bond entity and further comprising at least one electrostatic perturbing dangling bond.

15. The method of claim 1 wherein said material further comprises a surface; and wherein said material supports a localized charge inducing an electrostatic potential extending at least 1 Angstrom from the surface.

16. The method of claim 1 wherein said plurality of controllably quantum mechanically coupled dangling bonds each has a dangling bond energy that is greater than a bulk semiconductor valence band edge and simultaneously lower in energy than a conduction band edge bottom for said material such that each of said plurality of controllably quantum mechanically coupled dangling bonds is energetically decoupled from the conduction band of said material.

17. The method of claim 16 wherein said electronic state of said plurality of controllably quantum mechanically coupled dangling bonds is stable above 1 milli-Kelvin.

18. The method of claim 1 further comprising at least one additional electron within said plurality of controllably quantum mechanically coupled dangling bonds with the proviso that there exists at least one unoccupied dangling bond for each of said at least one additional electron present.

19. The method of claim 1 wherein said plurality of controllably quantum mechanically coupled dangling bonds numbers 2 dangling bonds and a rate of tunneling $k_{tun}$ therebetween satisfies the equation:

$$k_{tun}=(\omega/2\pi) \times D p_{1e}, \quad (11)$$

where $\omega/2\pi$ is a frequency of tunneling attempts, D is the tunneling coefficient, and $P_{1e}$ is the probability of having 1 extra electron in said 2 dangling bonds.

20. The method of claim 1 further comprising suspending at least one electrode for selectively modifying the electronic state of said plurality of controllably quantum mechanically coupled dangling bonds.

21. The method of claim 1 wherein the electronic state of said plurality of controllably quantum mechanically coupled dangling bonds is one of an infinite set of superpositioned values intermediate between digital logic levels of 0 and 1.

22. A quantum cellular automata comprising a plurality of quantum devices, each of the plurality of devices being formed according to claim 1; and interconnections therebetween.

23. The quantum cellular automata of claim 22 forming computations wherein said interconnections monitor the electronic state of said plurality of controllably quantum mechanically coupled dangling bonds.

24. A method for operating an electronic state data storage device comprising: suspending at least one electrode for selectively modifying an electronic state of a plurality of controllably quantum mechanically coupled dangling bonds in proximity to said plurality of controllably quantum mechanically coupled dangling bonds so as to perturb the electronic state of said plurality of controllably quantum mechanically coupled dangling bonds of a material with each of said plurality of controllably quantum mechanically coupled dangling bonds having a separation from the remainder of said plurality of controllably quantum mechanically coupled dangling bonds of at least one atom of said material.

25. The method of claim 24 further comprising placing an electrostatic species in proximity to said plurality of controllably quantum mechanically coupled dangling bonds so as to perturb the electronic state of said plurality of controllably quantum mechanically coupled dangling bonds of a material.

26. The method of claim 24 wherein the electronic state of said plurality of controllably quantum mechanically coupled dangling bonds is one of an infinite set of superpositioned values intermediate between digital logic levels of 0 and 1 measurable at a temperature above 1 milli-Kelvin.

* * * * *